United States Patent
Sadaka et al.

(10) Patent No.: US 7,208,357 B2
(45) Date of Patent: Apr. 24, 2007

(54) TEMPLATE LAYER FORMATION

(75) Inventors: Mariam G. Sadaka, Austin, TX (US);
Alexander L. Barr, Crolles (FR);
Bich-Yen Nguyen, Austin, TX (US);
Voon-Yew Thean, Austin, TX (US);
Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 148 days.

(21) Appl. No.: 10/919,922

(22) Filed: Aug. 17, 2004

(65) Prior Publication Data
US 2005/0070053 A1   Mar. 31, 2005

(51) Int. Cl.
H01L 21/00 (2006.01)
H01L 21/20 (2006.01)
H01L 21/425 (2006.01)

(52) U.S. Cl. ........ 438/166; 438/517; 438/479; 438/933; 257/E21.285; 257/E21.564; 257/E21.703

(58) Field of Classification Search ........ 438/166, 438/517, 479, 933, 617; 257/E21.285, E21.564, 257/E21.703
See application file for complete search history.

(56) References Cited

U.S. PATENT DOCUMENTS

| | | | |
|---|---|---|---|
| 3,912,559 A * | 10/1975 | Harigaya et al. | 438/216 |
| 4,851,257 A * | 7/1989 | Young et al. | 438/618 |
| 5,461,243 A | 10/1995 | Ek et al. | |
| 5,534,713 A | 7/1996 | Ismail et al. | |
| 5,759,898 A | 6/1998 | Ek et al. | |
| 5,846,857 A | 12/1998 | Ju | |
| 5,943,565 A | 8/1999 | Ju | |
| 5,998,807 A | 12/1999 | Lustig et al. | |
| 6,059,895 A | 5/2000 | Chu et al. | |
| 6,124,627 A | 9/2000 | Rodder et al. | |
| 6,259,138 B1 | 7/2001 | Ohtani et al. | |
| 6,339,232 B1 | 1/2002 | Takagi | |
| 6,369,438 B1 | 4/2002 | Sugiyama et al. | |

(Continued)

FOREIGN PATENT DOCUMENTS

JP   2000243946   12/1999

(Continued)

OTHER PUBLICATIONS

Chi et al., "Electrically active defects in surface preamorphized and subsequently RTP-annealed Si and the effect of titanium silicidation," *Proc. 1998 5th International Conference on Solid-State and Integrated Circuit Technology*, Oct. 21, 1998, Beijing, China, p. 324-327.

(Continued)

*Primary Examiner*—Michael Lebentritt
*Assistant Examiner*—Ron Pompey
(74) *Attorney, Agent, or Firm*—David G. Dolezal

(57) ABSTRACT

A process for forming a strained semiconductor layer. The process includes implanting ions into a semiconductor layer prior to performing a condensation process on the layer. The ions assist in diffusion of atoms (e.g. germanium) in the semiconductor layer and to increase the relaxation of the semiconductor layer. After the condensation process, the layer can be used as a template layer for forming a strained semiconductor layer.

26 Claims, 5 Drawing Sheets

U.S. PATENT DOCUMENTS

| | | | |
|---|---|---|---|
| 6,465,316 | B2 | 10/2002 | Hattori et al. |
| 6,524,935 | B1 | 2/2003 | Canaperi et al. |
| 6,562,703 | B1 | 5/2003 | Maa et al. |
| 6,583,437 | B2 | 6/2003 | Mizuno et al. |
| 6,621,131 | B2 | 9/2003 | Murthy et al. |
| 6,638,802 | B1 | 10/2003 | Hwang et al. |
| 6,709,909 | B2 | 3/2004 | Mizuno et al. |
| 6,723,541 | B2 | 4/2004 | Sugii et al. |
| 6,743,651 | B2 | 6/2004 | Chu et al. |
| 6,831,292 | B2 | 12/2004 | Currie et al. |
| 6,833,332 | B2 | 12/2004 | Christiansen et al. |
| 6,855,436 | B2 | 2/2005 | Bedell et al. |
| 6,881,632 | B2 | 4/2005 | Fitzgerald et al. |
| 7,005,676 | B2 * | 2/2006 | Tezuka et al. ............ 257/65 |
| 2001/0048119 | A1 | 12/2001 | Mizuno et al. |
| 2002/0168802 | A1 * | 11/2002 | Hsu et al. ............ 438/149 |
| 2003/0013305 | A1 | 1/2003 | Sugii et al. |
| 2003/0034529 | A1 | 2/2003 | Fitzgerald et al. |
| 2003/0040160 | A1 | 2/2003 | Huang et al. |
| 2004/0175872 | A1 | 9/2004 | Yeo et al. |
| 2004/0242006 | A1 | 12/2004 | Bedell et al. |
| 2004/0259334 | A1 | 12/2004 | Bedell et al. |

FOREIGN PATENT DOCUMENTS

| | | |
|---|---|---|
| WO | WO 02/33746 A1 | 4/2002 |
| WO | WO 02/45156 A2 | 6/2002 |
| WO | WO 02/45156 A3 | 6/2002 |

OTHER PUBLICATIONS

Fahey et al., "Point defects and dopant diffusion in silicon," *Reviews of Modern Physics*, Apr. 1989, vol. 61, No. 2, pp. 289-384.

Jung et al., "Implementation of Both High-Hole and Electron Mobility in Strained Si/Strained $Si_yGe_y$ on Relaxed $SI_{1-x}Ge_x(x>y)$ Virtual Substrate," *IEEE Device Letters*, vol. 24, No. 7, Jul. 2003, pp. 460-462.

Lee et al., "Sub-30 nm P+ abrupt junction formation in Strained Si-$Si_{1-x}Ge_x$ MOS device," *Technical Digest of the International Electron Devices Meeting*, Dec. 8, 2002, pp. 379-381.

LeGoues et al., "Kinetics and Mechanism of Oxidation of SiGe: Dry Versus Wet Oxidation," *Applied Physics Letters*, Feb. 13, 1989, vol. 54, No. 7, pp. 644-646.

LeGoues et al., "Oxidation Studies of SiGe," *Journal of Applied Physics*, Feb. 15, 1989, vol. 65, No. 4, pp. 1724-1728.

Lim, Y. S. et al., "Dry Thermal Oxidation of a Graded SiGe Layer", *Applied Physics Letters*, vol. 79, No. 22, Nov. 26, 2001, pp. 3606-3608.

Sawano et al., "Relaxation Enhancement of SiGe Thin Layers by Ion Implantation into Si Substrates," *IEEE*, 2002, pp. 403-404.

Tezuka et al., "Dislocation-free Formation of Relaxed SiGe-on-insulator Layers," *Applied Physics Letters*, May 13, 2002, vol. 80, No. 19, pp. 3560-3562.

Tezuka, T. et al., "Fabrication of Strained Si on an Ultrathin SiGe-on-insulator Virtual Substrate with a High-Ge Fraction", *Applied Physics Letters*, vol. 79, No. 12, Sep. 17, 2001, pp. 1798-1800.

Tezuka et al., "Ultrathin Body SiGe-on-Insulator pMOSFETs with High-Mobility SiGe Surface Channels," *IEEE Transactions on Electron Devices*, vol. 50, No. 5, May 2003, pp. 1328-1333.

Vyatkin et al., "Ion Beam Induced Strain Relaxation in Pseudomorphous Epitaxial SiGe Layers," *IEEE*, 2000, pp. 70-72.

* cited by examiner

TEMPLATE LAYER FORMATION

BACKGROUND OF THE INVENTION

1. Field of the Invention

This invention relates in general to semiconductor circuits and in particular to forming a strained semiconductor layer.

2. Description of the Related Art

For some applications, it is desirable to produce a layer of strained silicon over an insulator such as with a semiconductor on insulator (SOI) configuration. A strained silicon layer is a layer of silicon whose lattice spacing are different than a lattice spacing (e.g. 5.43095 A) of natural silicon (e.g. relaxed silicon crystal). One example of a strained silicon spacing is 5.4843 A for 1% tensile strain. A strained silicon layer may provide for a greater mobility of electrons and holes than a layer of relaxed silicon crystal.

One method of forming a strained silicon layer is to form a layer of silicon on a template layer having a lattice spacing larger than that of natural silicon crystal. The resultant silicon formed (e.g. by expitaxial deposition) on top of the template layer is stressed to provide a larger or smaller lattice spacing.

FIG. 1 shows a prior art wafer 101 in an example of a SOI substrate configuration that includes a silicon germanium (SiGe) layer 103 located on an insulating layer 105 (e.g. silicon dioxide). Insulating layer 105 is located on layer 107.

Referring to FIG. 2, to increase the content of germanium in a template layer and thereby increase its lattice spacing, layer 103 is subject to an oxidation process to enrich the amount of germanium in the bottom portion 205 of layer 103. The top portion is oxidized to form SiO2 layer 203. During the oxidation process, germanium atoms from the top portion of layer 103 are injected into portion 205 and diffuse throughout 205. In one example, the oxidation process involves heating wafer 101 as high as 1200 C in an atmosphere containing oxygen gas with an inert gas (e.g. Argon or $N_2$) as a dilutant.

The resulting $SiO_2$ layer 203 is then removed (e.g. by etching). A layer of silicon is then grown (e.g. epitaxially) on layer 205. Because layer 205 has a larger lattice spacing, the top silicon layer will be under tensile biaxial stress to provide a larger lattice spacing than with naturally occurring silicon crystal.

One problem with this process is that template layer 205 is not fully relaxed in that the lattice spacing does not fully correspond to a crystal having the percentage of germanium that layer 205 has. Accordingly, not all injected germanium atoms are on lattice sites, the layer is stressed by the underlying insulating layer 105, and the interstitial germanium and silicon atoms of layer 205 are prone to form defects.

Another problem that may occur with such a process is that the germanium may not adequately diffuse to the remaining portion of the silicon germanium layer. Accordingly, there may be a relatively high concentration of germanium at the top portion of the remaining layer as opposed to the germanium concentration of the lower portion of the remaining layer. These differences in germanium concentration in the template layer may cause dislocations which could lead to a dysfunctional semiconductor device formed in the area of the dislocations.

FIG. 3 shows a two dimensional view of a lattice 301 of silicon germanium crystal having smaller lattice spacing than a relaxed silicon germanium crystal having the same germanium content. Interstitial germanium atoms (e.g. 305) and interstitial silicon atoms (e.g. 311) are shown in FIG. 3 located between lattice sites (e.g. 313 and 315). These interstitial atoms may cause extended defects in the silicon germanium template layer and in a subsequently formed strained silicon layer.

What is needed is an improved method for forming a template layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

It has been discovered that providing a process for injecting vacancies in a layer of template layer material formed over an insulating layer allows for germanium (or other crystal lattice spacing modifying species) atoms to occupy lattice sites of a template layer, thereby increasing the effective lattice spacing of the crystal lattice of the template layer.

Figure 4:
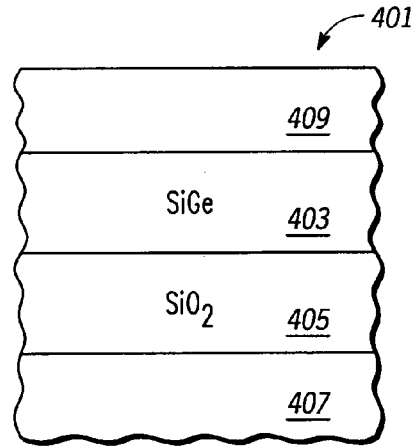
FIG. 4 is partial side view of a wafer during a stage in its manufacture according to one embodiment of the present invention.

FIG. 4 is a partial side view of a wafer after the wafer has been subjected to a nitridation process according to the present invention. Wafer 401 includes an insulating layer 405 made of e.g. silicon oxide located over a layer 407. Layer 407 is made of silicon germanium, but may be made of other materials e.g. poly silicon, mono silicon, amorphous silicon, glass, or quartz. Insulating layer 405 maybe made by forming a silicon germanium layer and then implanting oxygen into the silicon germanium layer followed by annealing to form insulating layer 405. The structure shown in FIG. 4 may also be formed by bonding a second wafer including SiGe to layer 405 and then cutting a portion of the second wafer, leaving a layer of silicon germanium on insulating layer 405. Such a layer of silicon germanium would have a greater thickness than layer 403 as shown in FIG. 4. In other embodiments, insulating layer 405 may extend to the bottom of the wafer. In still other embodiments, a wafer including silicon may be bonded to insulating layer 405 and then cut to leave a layer of silicon on layer 405. A layer of SiGe may be formed on the layer of silicon using an epitaxy process.

Layer 409 is a layer of silicon nitride that was grown by subjecting the layer of silicon germanium (not shown) on layer 405 to a nitridation process. In one embodiment, the nitridation process involves flowing ammonia ($NH_3$) over the silicon germanium layer on insulating layer 405 at an elevated temperature. The nitrogen in ammonium reacts with the silicon of the silicon germanium layer to grow the silicon nitride layer 409, thereby reducing the silicon germanium layer to the thickness of silicon germanium layer 403 as shown in FIG. 4. During the nitridation process, vacancies are being injected into the remaining portion (layer 403) of the silicon germanium layer and diffused throughout layer 403. A vacancy is space in a lattice site void of an atom. Also during the nitridation process, germanium atoms from the top portion of the silicon germanium layer are being injected into the remaining portion (layer 403) of the silicon germanium layer. These germanium atoms recombine with the vacancies of layer 403 becoming substitutional. Also interstitial germanium (as well as silicon) atoms recombined with the vacancies becoming substitutional.

Vacancies are injected into layer 403 by the silicon atoms in a lattice of layer 403 propagating upward to combine with the nitrogen of the ammonia to form silicon nitride layer 409. Because the germanium is not reactive with the ammonia, the germanium atoms are injected by diffusion into the lattice of the remaining silicon germanium layer 403.

Figure 5:
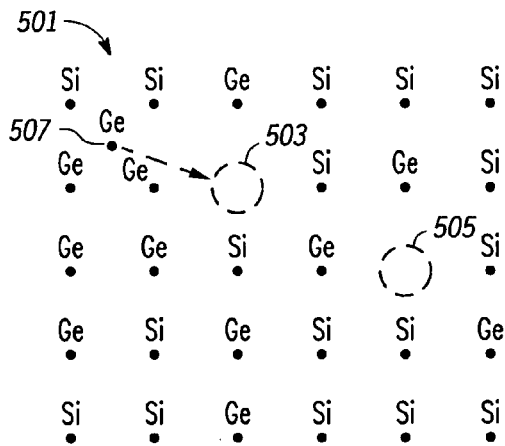
FIG. 5 is a partial two dimensional view of a template layer lattice according to the present invention.

FIG. 5 shows an example of a silicon germanium lattice 501. Lattice 501 includes vacancies 503 and 505. During the nitridation process, germanium atoms (e.g. interstitial germanium atom 507) recombine with vacancies (e.g. 503) to fill the lattice structure.

Referring back to FIG. 4, nitride layer 409 is stripped by an etching selective to silicon germanium layer 403. Layer 403 is used as a template layer for a subsequent application of strained expitaxial silicon layer (see layer 1009 of FIG. 10).

Injecting vacancies into a template layer may render existing interstitial atoms substitutional in the crystal lattice of the template layer. This reduces the number of interstitial atoms in the template layer thereby reducing the defect density of the template layer. Also injecting vacancies into a template layer may allow a reconstruction of the interface between the insulating layer 405 and template layer 403 thereby allowing for a higher degree of relaxation of template layer 403.

In other embodiments, other processes may be utilized for injecting vacancies into template layer material. For example, the layer of silicon germanium template layer material located on layer 405 may be subjected to a silicide process where metal (e.g. titanium) is deposited on the template layer material and reacts (when heated) with the silicon of the template layer material to form a layer of a silicon titanium compound (at the location approximately of layer 409 as shown in FIG. 4). During the silicide process, vacancies are injected into the remaining portion of the silicon germanium template layer material (e.g. layer 403) by the silicon atoms of the remaining portion propagating upward to combine with the titanium to form the titanium silicide layer (e.g. at the location of 409).

In another embodiment, a template layer material maybe subjected to an oxynitride process to enrich the germanium in the template layer and to inject vacancies in the template layer. In one example of a oxynitride process, ammonia and oxygen are flowed across the surface of the template layer material to grow a layer of oxynitride from the layer of template layer material. During the oxynitride process, vacancies are injected into the lower portion of the layer of template material by the silicon atoms in that portion propagating upward to combine with the nitrogen of the ammonia and the oxygen to form a silicon oxynitride layer at the location corresponding to layer 409 of FIG. 4. Because the germanium is not reactive with the ammonia and oxygen, the germanium atoms are injected by diffusion into the silicon germanium lattice of the lower portion of the template layer material (located at the location of layer 403 in FIG. 4). The layer of oxynitride is then removed wherein the lower portion (e.g. 403) of the template material is used as the template. In other embodiments, nitric oxide gas (NO) or nitrous oxide gas ($N_2O$) may be flowed across the surface of the template layer material to grow a layer of oxynitride from the layer of template layer material.

In another embodiment, a layer of template material may be subject to an oxidation process where a chlorine bearing gas (e.g. hydrogen chloride gas (HCl), chlorine gas ($Cl_2$), carbon tetrachloride gas ($CCl_4$), or trichloroethane gas ($C_2H_3Cl_3$)) is introduced with the oxygen to inject germanium atoms and vacancies into the template layer. In one example of such an oxidation process, HCl and oxygen (and in some embodiment argon or nitrogen ($N_2$) as diluents) are flowed across the layer of template material at 1100 C to grow a layer of silicon oxide on the layer of template material. In one embodiment, the HCl is at a concentration of 6%, but may be at other concentrations in other embodiments e.g. 0.1–10% in other embodiments. The HCl concentration may be higher in other embodiments depending upon the oxidation equipment. The silicon oxide layer is located at the location corresponding to layer 409 of FIG. 4. The introduction of chloride is believed to increase the oxidation rate of the oxidation process and vacancies are injected in the layer of template material.

One further advantage that may occur with the use of an oxidation process with HCl (or other chlorine bearing gas) is that the oxidation process may be performed at relatively lower temperatures (e.g. 1050–1100 C in some embodiments) than with a regular oxidation process. Because during an oxidation process, the remaining portion of the layer of template material is enriched with germanium, the melting point of the enriched germanium layer is decreased.

Accordingly, the ability to perform oxidation at a lower temperature (1050–1100 C as opposed to 1200 C) allows for the oxidation process to be performed and avoid melting of the layer of template material. Furthermore, the ability to perform oxidation at lower temperatures may make the oxidation process easier to integrate with CMOS processes.

Furthermore, introducing HCl (or other chlorine bearing gas) in an oxidation process increases the oxidation rate, thereby decreasing the time needed to perform oxidation. Furthermore, with some embodiments, the HCl does not affect the quality of the grown oxide. Thus, the oxide retains a high selectivity between the oxide and the remaining layer of template material.

In other embodiments, the oxidation with the chlorine bearing gas is performed at temperatures between 700–1200 C, but may be performed at other temperatures in other embodiments. In other embodiments, the oxidation may be performed where the HCl or other chlorine bearing gas is introduced during at least one portion of the oxidation process. For example, in one embodiment, the oxidation may be performed for 30 minutes at 1050 C with oxygen gas and then for thirty minutes at 1050 C with oxygen and HCl gas. In other embodiments, the HCl maybe introduced at multiple times during the oxidation process. In other embodiments, the oxidation and etch cycle may be performed in multiple steps to make the vacancy injecting process more efficient and to simplify the oxide etching process.

In other embodiments, other materials may be utilized as template layer material such as silicon germanium carbon ($Si_{1-x-y}Ge_xC_y$, where Ge content>C content and x>y), Silicon tin (SiSn), Silicon Carbon ($Si_{1-y}C_y$), Silicon tin germanium (SiSnGe), and germanium carbon (GeC).

Figure 6:
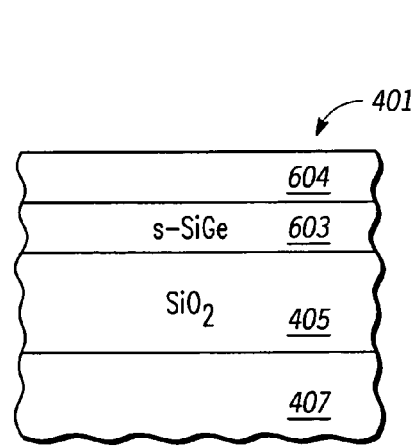
FIG. 6 is partial side view of a wafer during another stage in its manufacture according to one embodiment of the present invention.

In some embodiments, a post condensation step may be applied to the wafer after the removal of the silicon nitride layer 409 (a silicon oxynitride, titanium silicide, silicon oxide layer in some embodiments). During the oxidation process, silicon of layer 403 propagates upward to combine with the oxygen to grow a silicon oxide layer 604 (see FIG. 6), and thereby consuming a portion of layer 403. Because the germanium is not reactive with oxygen, the germanium atoms are injected by diffusion into the lattice of the remaining portion of layer 403 (layer 603 in FIG. 6). Layer 604 is then etched wherein layer 603 is utilized as a template layer. Layer 603 is more strained than layer 403 due to the post oxidation process. In other embodiments, a post oxidation process may be performed after a silicidation or oxynitride process.

In other embodiments, the performing of a vacancy injecting process may be performed subsequent to a condensation process (e.g. subsequent to the oxidation of the template layer material).

Figure 1:
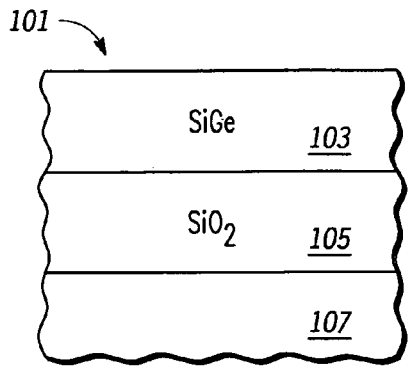
FIG. 1 is a partial side view of a prior art wafer.
Figure 2:
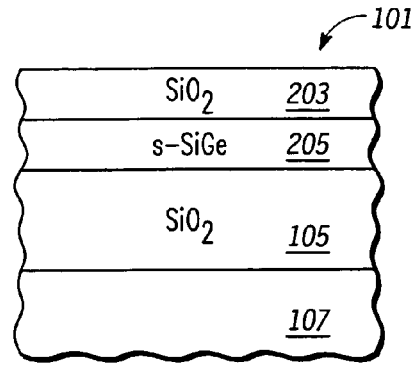
FIG. 2 is a partial side view of a prior art wafer.
Figure 3:
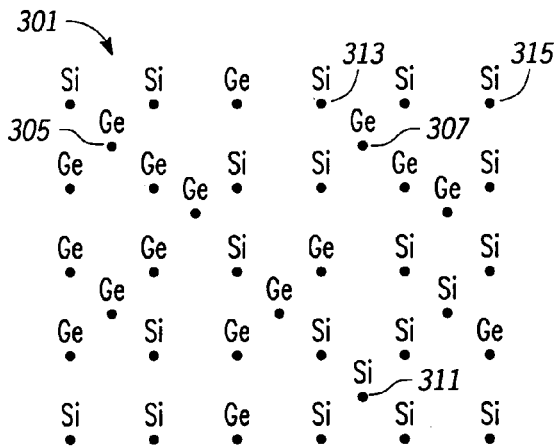
FIG. 3 is a partial two dimensional view of a prior art template layer lattice.
Figure 7:
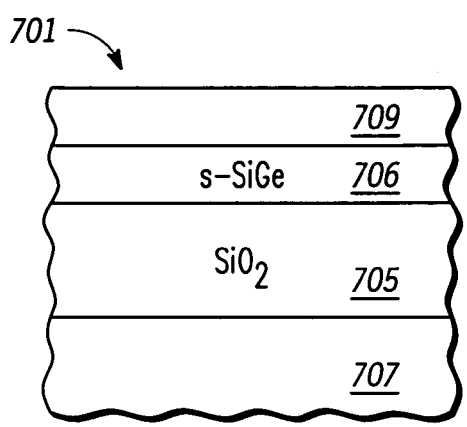
FIG. 7 is partial side view of a wafer during a stage in its manufacture according to another embodiment of the present invention.

FIG. 7 is a partial cross sectional view of a wafer that has been first subjected to an oxidation process and then a nitridation process to inject vacancies into the template layer. Layers 706 and 709 are formed from a nitridation process of a layer of strained silicon germanium (e.g. similar to layer 205 of FIG. 2). The strained silicon germanium layer was formed by an oxidation process where an oxide layer (e.g. 203) was grown on a silicon germanium layer (e.g. 103 of FIG. 1). The resultant strained silicon germanium layer (e.g. layer 205) was germanium rich due the diffusion of germanium atoms into the resultant layer from the consumed portion of the germanium layer. Because the oxidation process is not a vacancy generating process, a portion of the diffused germanium atoms become interstitial in the lattice of the strained silicon germanium layer (e.g. 205). Afterwards, the oxide layer (e.g. 205) is removed. In other embodiments, only a portion of the oxide layer (e.g. 205) is removed.

During a subsequent nitridation process, a silicon nitride layer 709 is grown from the strained silicon germanium layer (e.g. 205). Vacancies are injected into the remaining silicon germanium layer 706 by the silicon atoms in a lattice of layer 706 propagating upward to combine with the nitrogen to form silicon nitride layer 709. These vacancies recombine with the interstitial germanium of the germanium rich strained silicon germanium layer 706 to reduce the number of interstitial germanium. Also, germanium atoms of the consumed portion of the strained silicon germanium (e.g. 205) are injected by diffusion into the lattice of layer 706. Layer 709 is removed and layer 706 is used as a template layer. Because of the injection of vacancies, the resulting layer 706 is less strained than the preceding strained silicon germanium layer (e.g. 205).

Figure 8:
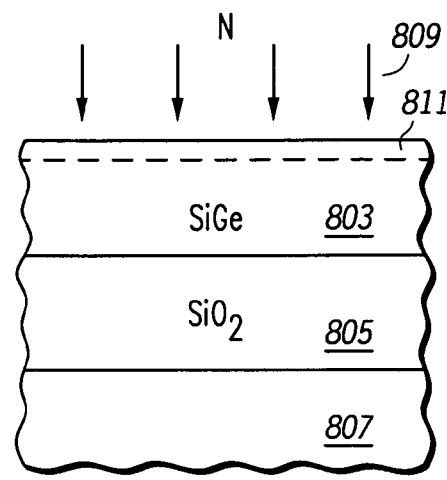
FIG. 8 is partial side view of a wafer during a stage in its manufacture according to another embodiment of the present invention.
Figure 9:
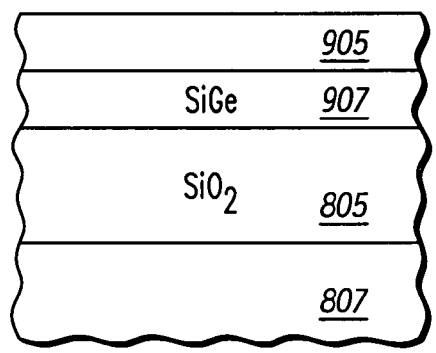
FIG. 9 is partial side view of a wafer during a stage in its manufacture according to another embodiment of the present invention.

FIGS. 8 and 9 show a wafer during stages of another vacancy injecting process. In FIG. 8, nitrogen (809) is implanted into the top portion 811 of a layer of template material 803 (e.g. SiGe) located over insulating layer 805. In some embodiments, the nitrogen is implanted at doses larger than 10^13 atoms/cm2 and at energies between 10–50 keV. Wafer 801 is then subject to an oxidation process wherein a layer of oxynitride 905 is grown, and vacancies and germanium atoms are injected into the lattice of the bottom portion 907 of layer 803 (See FIG. 9). Afterwards, layer 905 is etched where portion 907 serves as the template layer.

In other embodiments, a layer of template material may be subject to an oxidation process and then a subsequent inert gas post bake (anneal) process. In one embodiment, a hydrogen post bake process is performed at T=900–1100 C for 1–100 min with $H_2$ gas being flowed over the $SiO_2$ layer at a pressure of $PH_2$=1–100 Torr. Vacancies are injected into the remaining layer of template material during the inert gas post bake process. In other embodiments, other inert gases such as argon may be used with low oxygen pressure ($PO_2$).

In other embodiments, the post bake process may be performed with a chlorine bearing gas. In one embodiment, following a condensation process (e.g. oxidation, nitration), a wafer is heated at 1050 C for 30 minutes with HCl (e.g. at a 6% concentration) being flowed over the wafer at a pressure of e.g. $PH_2$=1–100 Torr. In other embodiments, other gases (e.g. inert gases such as argon, $N_2$, and Helium) may be flowed (e.g. at 6% concentration) with the HCl as well during the post bake process. In other embodiments, the wafer may be heated at other temperatures during the post bake process (e.g. 700–1200 C or at other temperatures), the post bake may be performed in the presences of other gases, the post bake may be performed with other gas concentrations (e.g. HCl concentrations of 0.1–10%), the post bake may be performed at other gas pressures (1–100 Torr), and/or for other durations (e.g. 1–1200 minutes in some embodiments).

Performing a post bake with a chlorine bearing gas injects vacancies in the remaining portion of the silicon germanium layer. It may also improve diffusion due to enhancing the strain induced diffusion, which may lead to a more uniform germanium profile (less germanium pile up) and a more relaxed silicon germanium layer.

Figure 10:
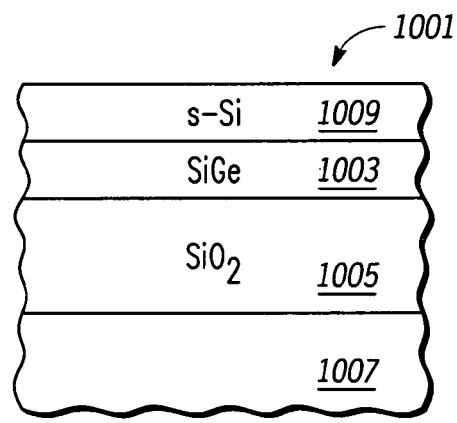
FIG. 10 is partial side view of a wafer during a stage in its manufacture according to one embodiment of the present invention.

Referring to FIG. 10, after the formation of a template layer 1003 over insulating layer 1005 (e.g. by a process similar to any one of the processes described above) a layer of strained silicon 1009 is formed (e.g. epitaxially grown) on template layer 1003. Afterwards, devices such as transistors are formed in strained silicon and template layer. In one embodiment, the channel regions of transistors are formed in the strained silicon layer 1009.

In other embodiments, a layer of monocrystalline silicon is formed on the insulating layer (e.g. 405). A layer of silicon germanium (or other template material) would then be formed on the layer of silicon material. During vacancy injecting processes and oxidation processes (in some embodiments), germanium atoms and vacancies would be injected into the silicon layer wherein the silicon layer would serve as a portion of the template layer.

FIGS. 11–16 show a cross-sectional view of a wafer 1101 during various stages in the manufacture of semiconductor devices. The method set forth in the views of FIGS. 11–16 include another vacancy injecting process.

Figure 11:
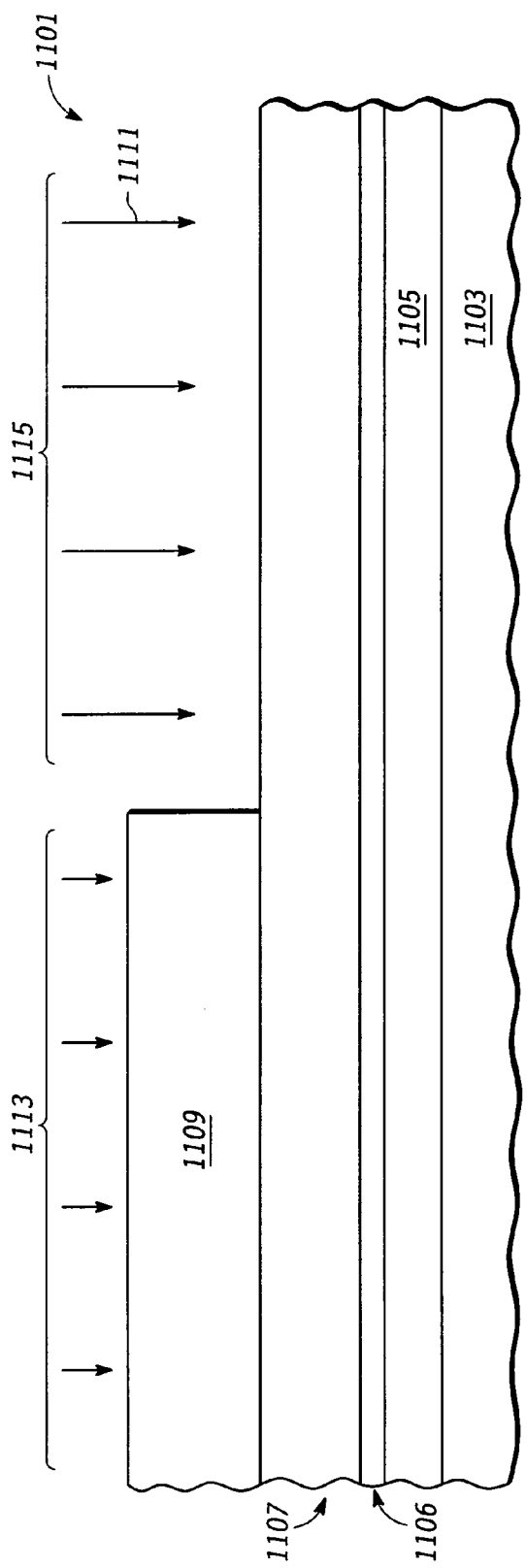
FIG. 11 is partial side view of a wafer during a stage in its manufacture according to another embodiment of the present invention.

Referring to FIG. 11, wafer 1101 has an SOI configuration with an insulator 1105 is located on silicon substrate 1103. A silicon layer 1106 is located on insulator 1105. A layer of silicon germanium 1107 is located over layer 1105.

In the embodiment shown, P-channel region 1113 is masked with photo resist 1109. Silicon germanium layer 1107 is then selectively implanted with ions 1111 to form implanted region 1203 (see FIG. 12) in N-channel region 1115. These implants inject vacancies and form other types of point defects in region 1203. In other embodiments, P-channel region 113 is masked with a dielectric or hard material such as e.g. nitride or oxide with photo resist on top.

In one embodiment, a silicon cap layer (200 A) (not shown) may be formed on layer 1107 prior to region 1113 being masked.

In one embodiment, the ions are implanted at a depth that is less than the total thickness of layer 1107. In one embodiment where layer 1107 is 1000 A, ions 1111 are implanted to a depth of between 100 and 900 A. In other embodiments, ions 1111 are implanted to about 100 A above silicon layer 1106. In one embodiment, ions 1111 are implanted in layer 1106.

In one embodiment, ions 1111 include germanium. In other embodiments, ions 1111 include silicon, boron, arsenic, phosphorous, or combinations thereof. In some embodiments the different types of ions are implanted at different depths. In some embodiments, the ions of different types and depths are implanted at different times. In one embodiment, silicon ions may be implanted into the silicon germanium layer 1107 and germanium ions may be implanted into silicon layer 1106.

In some embodiments where the implanted ions include boron, phosphorous, or arsenic, these ions may also be used to dope the wells to a desired conductivity in addition to injecting vacancies. In one embodiment, ions 1111 include boron to provide N-channel region 1115 with a doped well region for a subsequently formed transistor in that region. In one embodiment, ions 1111 include boron implanted at a dose of 5e12 atoms per centimeters squared at an energy of 10 KeV.

In other embodiments, ions 1111 include boron implanted at a dose of 3e15 atoms per centimeters squared at an energy of 3 KeV. In other embodiments, ions 1111 include germanium at a dose of 1e13 atoms per centimeter squared at an energy of 40 KeV. In another embodiments, ions 1111 may be implanted at other doses and/or at other energies.

Figure 12:
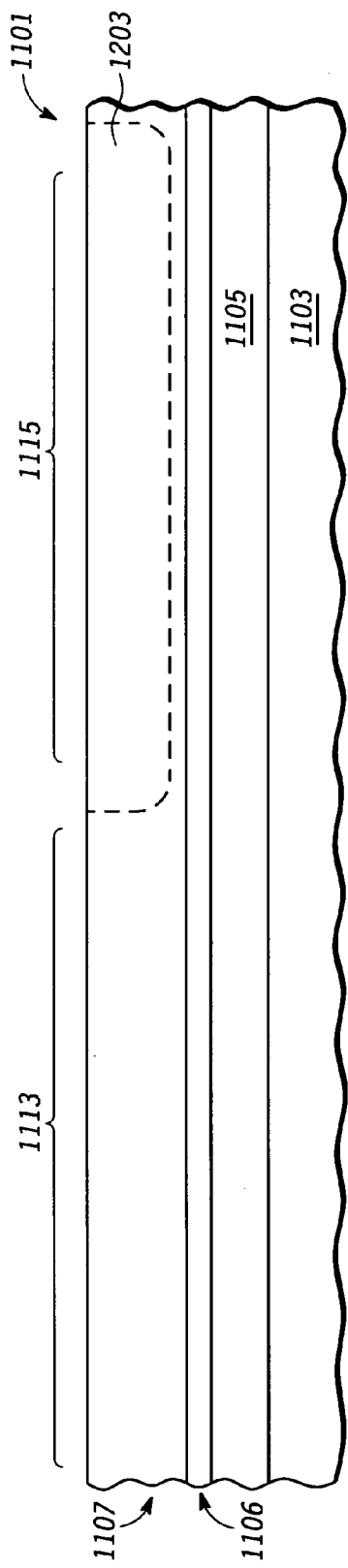
FIG. 12 is partial side view of a wafer during another stage in its manufacture according to another embodiment of the present invention.

FIG. 12 shows wafer 1101 after photo resist 1109 is removed. In other embodiments, region 1115 may be subsequently masked where ions may be implanted in region 1113 for injecting vacancies in layer 1107. With such an embodiment, the amount of vacancy injection may be different in the N-channel region than the P-channel region. Such a difference may be utilized to differentially control the strain of a subsequently formed silicon layer (e.g. 1503) in the P-channel region and the N-channel region.

Figure 13:
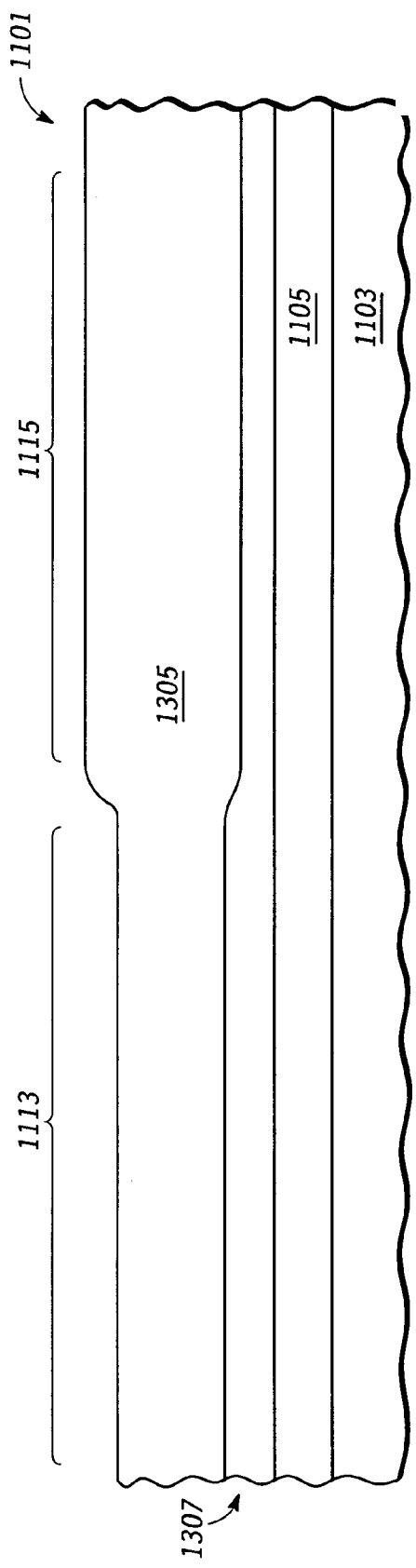
FIG. 13 is partial side view of a wafer during another stage in its manufacture according to another embodiment of the present invention.

FIG. 13 shows wafer 1101 after a condensation operation is performed on wafer 1101. In one embodiment, the condensation operation includes an oxidation process that consumes a portion of layer 1107 and forms an oxide 1305 over a remaining portion of silicon germanium layer 1107. In the embodiment shown, the remaining portion of the silicon germanium layer 1107 after the oxidation process is represented by layer 1307. During the oxidation process, germanium atoms in the consumed portion of layer 1107 diffused to the remaining portion of layer 1107 to increase the germanium concentration of the remaining portion. Also germanium atoms of layer 1107 diffuse into layer 1106. Layer 1307 in FIG. 13 represents layer 1106 and the remaining portion of layer 1107 after the oxidation process.

The injections of ions 1111 into layer 1107 inject vacancies in that layer which enable the germanium to diffuse more quickly and uniformly in the remaining portion of the layer during the condensation process. Accordingly, germanium pile up may be reduced as compared to an oxidation process (or other condensation process) with no prior implantation.

In one embodiment, the condensation process involves flowing oxygen gas and HCl gas (e.g. 6%) or other chlorine bearing gas (and in some embodiment argon or nitrogen ($N_2$) as diluents) across wafer 1101 at a temperature e.g. of 1050 degrees for e.g. 30–60 minutes. In other embodiments, other oxidation processes maybe utilized. In other embodiments, other condensation processes (e.g. nitridation, oxynitridation) maybe be utilized.

In the embodiment shown, the implantation of ions 1111 (e.g. germanium ions) into layer 1107 in region 1115, causes an increase in the oxidation rates over areas where with no pre-condensation implantation. Accordingly, in region 1115 silicon oxide 1305 is thicker and more of layer 1107 is consumed due to the increased oxidization rates than with region 1113 for a given oxidation time. Accordingly, layer 1307 is thicker in region 1113 than in region 1115.

Figure 14:
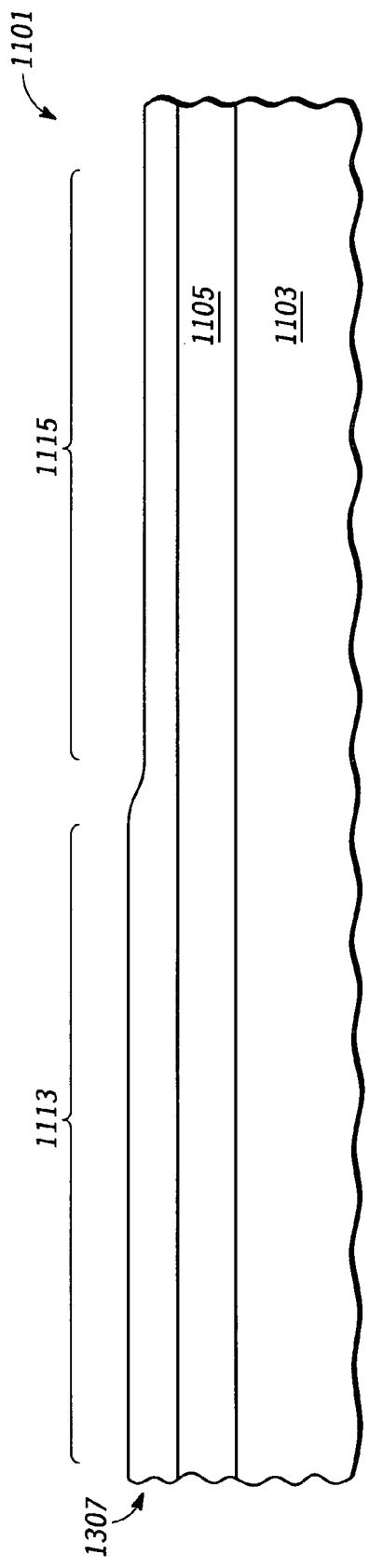
FIG. 14 is partial side view of a wafer during another stage in its manufacture according to another embodiment of the present invention.

FIG. 14 shows wafer 1101 after the removal of oxide 1305. In some embodiments a post bake (e.g. with HCl gas) of the wafer may be performed after the condensation operation.

Figure 15:
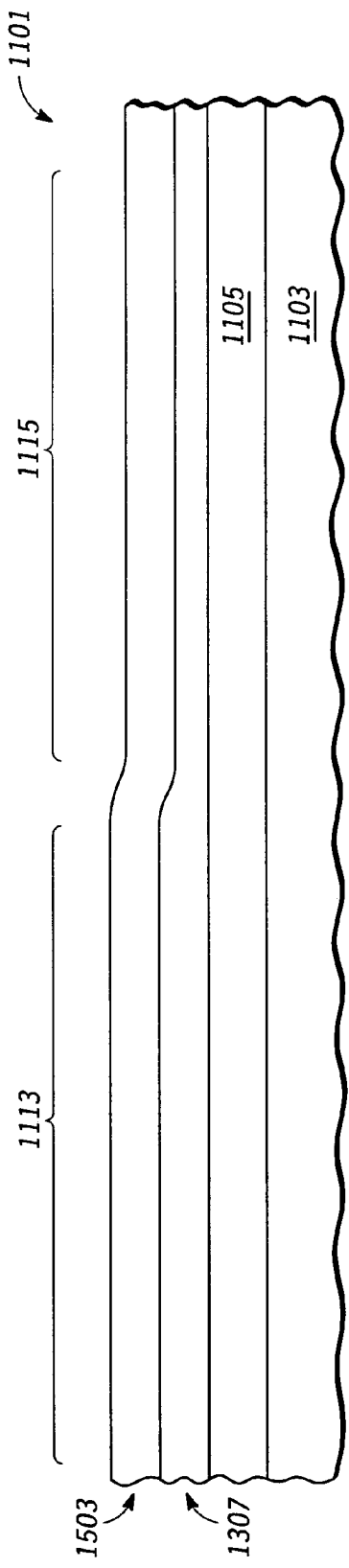
FIG. 15 is partial side view of a wafer during another stage in its manufacture according to another embodiment of the present invention.

FIG. 15 shows wafer 1101 after a layer of stained silicon 1503 is epitaxially grown (e.g. 200 A) on layer 1307 with layer 1307 serving as template layer.

In some embodiments, the vacancies injected by ions 1111 provide for a more relaxed layer of silicon germanium in region 1115 than in region 1113. For example, the portion of layer 1307 in region 1115 is relatively more relaxed than the portion of layer 1307 in P-channel region 1113. In one embodiment where germanium atoms were implanted at a dose of 1e13 per square centimeter at an energy of 40 KeV, the relaxation of the implanted region was increased from 32% (no implantation) to 52% (with implantation).

Accordingly, strained silicon layer 1503 of region 1115 has a relatively more tensile strain than the strain of layer 1503 in region 1113 in that layer 1307 is relatively more relaxed in region 1115 than in region 1113. The ability to differentiate strain may provide for a circuit with better performance of the N-channel devices and P-channel device due to differences in tensile strain of the channel regions of those devices.

Figure 16:
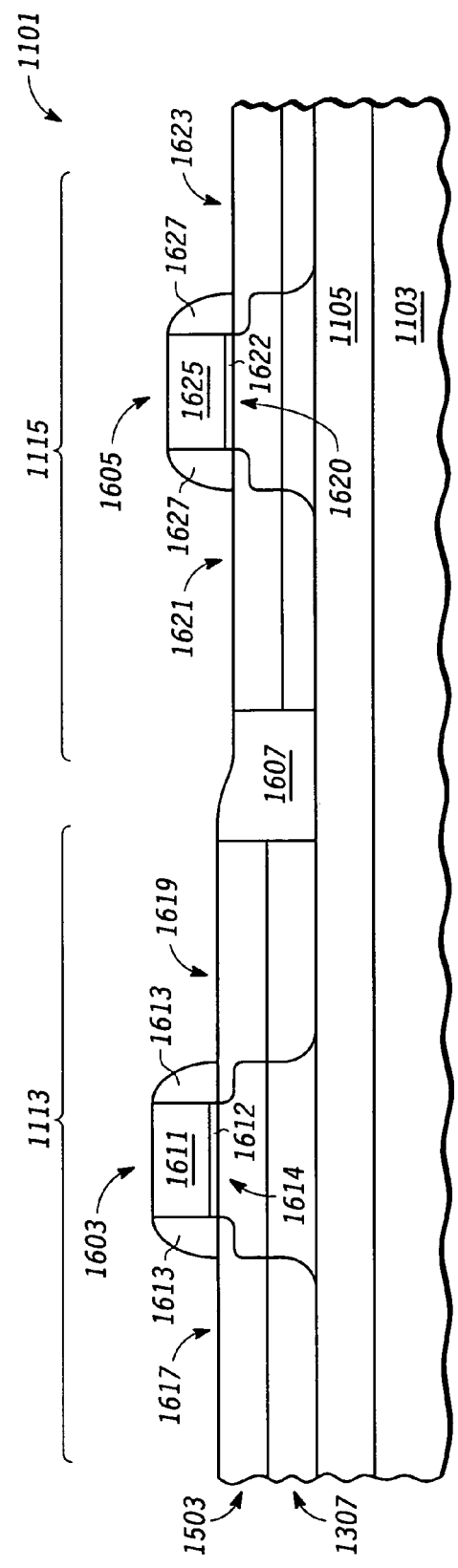
FIG. 16 is partial side view of a wafer during another stage in its manufacture according to another embodiment of the present invention.

FIG. 16 is a partial side view of wafer 1101 after the formation of an P-channel transistor 1603 in P-channel region 1113 and an N-channel transistor 1605 in region 1115. Transistor 1603 includes a gate 1611, a sidewall spacer 1613, a gate oxide 1612, and source/drain regions 1617 and 1619 formed in layers 1503 and 1307. Transistor 1603 also includes a channel region located below gate 1611 in layer 1503. Transistor 1605 includes a gate 1625, a sidewall spacer 1627, a gate oxide 1622, and source/drain regions 1621 and 1623 formed in layers 1503 and 1307. Transistor 1605 also includes a channel region 1620 located below gate 1625 in layer 1503. An isolation trench insulator 1607 is located between region 1113 and region 1115. Wafer 101 includes other N-channel and P-channel transistors not shown. Transistors of other embodiments may have other configurations.

In other embodiments, one of the N-channel region or the P-channel region maybe masked during the condensation process. Accordingly, only selective parts of layer 1107 are consumed (the parts in unmasked areas) during the condensation process. In other embodiments, the other region (e.g. 1113 or 1115) that was initially masked, is then exposed and the region that was initially unmasked (e.g. 1113 or 1115) is masked. A second condensation operation is then performed on the subsequently unmasked region. Accordingly, the strain of layer 1503 in region 1113 and the strain of layer 1503 in region 1115 can further be differentiated with separate condensation processes for each area.

In one aspect of the invention, a method of forming a semiconductor device includes providing a wafer including a first semiconductor layer. The first semiconductor layer includes silicon and germanium. The method also includes implanting ions into the first semiconductor layer and performing a condensation process on the first semiconductor layer after the implanting. The method also includes forming a second semiconductor layer including silicon over the first semiconductor layer after the performing the condensation process and forming a transistor including a channel region. At least a portion of the channel region is located in the second semiconductor layer.

In another aspect of the invention, a method of forming a semiconductor device includes providing a first layer having a crystalline structure including silicon atoms and germanium atoms over an insulator layer. The method also includes implanting ions into the first layer and performing a condensation process after the implanting. The condensation process consuming a portion of the first layer and forming a second layer on the crystalline structure including silicon atoms. The method also includes removing the second layer and forming a semiconductor layer including silicon atoms over a remaining portion of the first layer after removing the second layer. The method further includes forming a transistor including a channel region. At least a portion of the channel region is located in the semiconductor layer.

In another aspect of the invention, a method of forming a semiconductor device includes providing a wafer having a semiconductor on insulator configuration. The wafer includes a first semiconductor layer. The method includes implanting ions into the first semiconductor layer and performing a condensation process on the first semiconductor layer after the implanting. The condensation process consumes a portion of the first semiconductor layer and forms a layer on a remaining portion of the first semiconductor layer. The method further consumes removing the layer on the remaining portion and forming a second semiconductor layer, after the performing the condensation process. The forming the second semiconductor layer includes using the remaining portion as a template layer. The method still further includes forming a transistor including a channel region. At least a portion of the channel region is located in the second semiconductor layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a semiconductor device comprising:
   providing a wafer including a first semiconductor layer, the first semiconductor layer including silicon and germanium;
   implanting ions into the first semiconductor layer, wherein the implanting ions into the first semiconductor layer further comprises implanting ions into the first semiconductor layer at a first region of the wafer;
   performing a condensation process on the first semiconductor layer after the implanting;
   forming a second semiconductor layer including silicon over the first semiconductor layer after the performing the condensation process;
   forming a transistor including a channel region, at least a portion of the channel region is located in the second semiconductor layer, the transistor is located in the first region.

2. The method of claim 1, wherein the wafer has a semiconductor on insulator (SOI) configuration.

3. The method of claim 1 wherein the forming the second semiconductor layer further comprises:
   forming the second semiconductor layer on a remaining portion of the first semiconductor layer.

4. The method of claim 1, wherein the forming the second semiconductor layer includes using a remaining portion of the first semiconductor layer as a template layer.

5. The method of claim 1, further comprising:
   forming a silicon cap layer on the first semiconductor layer prior to the implanting.

6. The method of claim 1 wherein:
   the implanting the ions into the first semiconductor layer at a first region of the wafer includes implanting ions into the first semiconductor layer at the first region and not implanting ions into the first semiconductor layer at a second region of the wafer.

7. The method of claim 6 wherein after the performing the condensation process, the first semiconductor layer in the first region has a first characteristic strain and the first semiconductor layer in the second region has a second characteristic strain;
   the first characteristic strain is different than the second characteristic strain.

8. The method of claim 7 wherein the first characteristic strain is more relaxed than the second characteristic strain.

9. The method of claim 8 wherein the second semiconductor layer in the first region has a first tensile strain and the second semiconductor layer in the second region has a second tensile strain different than the first tensile strain.

10. The method of claim 6 further comprising:
    forming a second transistor including a channel region, at least a portion of the channel region of the second transistor is located in the second semiconductor layer at the second region.

11. The method of claim 1 wherein the implanting ions includes implanting ions for forming a well region for a transistor.

12. The method of claim 1, wherein the ions are implanted at a depth that is less than the bottom of the first semiconductor layer.

13. The method of claim 1, wherein the ions are implanted at a depth that is in the middle 80% of the first semiconductor layer.

14. The method of claim 1, wherein the ions are implanted at a bottom portion of the first semiconductor layer.

15. The method of claim 1, wherein the implanting ions forms vacancies in the first semiconductor layer, assists in germanium diffusion within the first semiconductor layer during the performing the condensation process, and provides for a more relaxed remaining portion of the first semiconductor layer after the performing the condensation process.

16. The method of claim 1, wherein the ions include at least one of silicon, germanium, boron, arsenic, or phosphorous.

17. The method of claim 1, wherein performing the condensation process includes flowing oxygen gas and a chlorine bearing gas across the first semiconductor layer at a temperature of 1100 Celsius or less.

18. A method of forming a semiconductor device comprising:
    providing a first layer having a crystalline structure including silicon atoms and germanium atoms over an insulator layer;
    implanting ions into the first layer, wherein the implanting includes-implanting ions into the first layer at a first region of a wafer;
    performing a condensation process after the implanting, the condensation process consuming a portion of the first layer and forming a second layer on the crystalline structure including silicon atoms;
    removing the second layer;
    forming a semiconductor layer including silicon atoms over a remaining portion of the first layer after removing the second layer,
    forming a transistor including a channel region, at least a portion of the channel region is located in the semiconductor layer at the first region.

19. The method of claim 18 wherein the forming a semiconductor layer includes using the first layer as a template layer.

20. The method of claim 18, wherein the implanting into the first layer at a first region includes not implanting into the first layer at a second region of the wafer, wherein a crystalline structure of a remaining portion of the first layer in the first region is characterized as more relaxed than a crystalline structure of a remaining portion of the first layer in the second region.

21. The method of claim 20 wherein after the condensation process, the first layer in the first region has a first characteristic strain and the first layer in the second region has a second characteristic strain;
    the first characteristic strain is different than the second characteristic strain.

22. The method of claim 18, wherein the implanting at the first region includes not implanting into the first layer at a second region, the method further comprising:
    forming a second transistor including a channel region in the second region, at least a portion of the channel region of the second transistor is located in the semiconductor layer of the second region.

23. The method of claim 18, wherein the implanting includes implanting a dose being on the order of 3E15 atoms per centimeter squared or less and the implant energy being on the order of 40 KeV or less.

24. The method of claim 18, wherein the ions include at least one of silicon, germanium, boron, arsenic, or phosphorous.

25. The method of claim 18, wherein performing the condensation-process includes flowing oxygen gas and a chlorine bearing gas across the first layer at a temperature of 1100 degrees Celsius or less.

26. A method of forming a semiconductor device comprising:
    providing a wafer having a semiconductor on insulator configuration, the wafer including
    a first semiconductor layer,
    implanting ions into the first semiconductor layer, wherein the implanting includes implanting ions into the first layer at a first region of a wafer;
    performing a condensation process on the first semiconductor layer after the implanting, wherein the condensation process consumes a portion of the first semiconductor layer and forms a layer on a remaining portion of the first semiconductor layer;
    removing the layer on the remaining portion;
    forming a second semiconductor layer, after the performing the condensation process, wherein the forming the second semiconductor layer includes using the remaining portion as a template layer; and
    forming a transistor including a channel region, at least a portion of the channel region is located in the second semiconductor layer at the first region.

* * * * *

UNITED STATES PATENT AND TRADEMARK OFFICE
CERTIFICATE OF CORRECTION

PATENT NO. : 7,208,357 B2  Page 1 of 1
APPLICATION NO. : 10/919922
DATED : April 24, 2007
INVENTOR(S) : Mariam G. Sadaka It is certified that error appears in the above-identified patent and that said Letters Patent is hereby corrected as shown below:

In Column 12, Line 25, Claim No. 25:

Change "condensation-process includes flowing oxygen" to --condensation process includes flowing oxygen--

In Column 12, Line 35, Claim No. 26:

Change "the first layer at a first region" to --the first semiconductor layer at a first region--

In Column 12, Line 35, Claim No. 26:

Change "first region of a wafer;" to --first region of the wafer;--

Signed and Sealed this

Third Day of June, 2008

JON W. DUDAS
*Director of the United States Patent and Trademark Office*